(12) United States Patent
Yang et al.

(10) Patent No.: US 7,560,312 B2
(45) Date of Patent: Jul. 14, 2009

(54) VOID FORMATION FOR SEMICONDUCTOR JUNCTION CAPACITANCE REDUCTION

(75) Inventors: Haining Yang, Wappingers Falls, NY (US); Xiangdong Chen, Poughquag, NY (US)

(73) Assignee: International Business Machines Corporation, Armonk, NY (US)

( * ) Notice: Subject to any disclaimer, the term of this patent is extended or adjusted under 35 U.S.C. 154(b) by 163 days.

(21) Appl. No.: 11/462,835

(22) Filed: Aug. 7, 2006

(65) Prior Publication Data

US 2008/0029829 A1 Feb. 7, 2008

(51) Int. Cl.
*H01L 21/44* (2006.01)
(52) U.S. Cl. .............. 438/123; 438/199; 438/217; 438/229; 438/275; 438/528; 257/E21.335; 257/E21.633
(58) Field of Classification Search .............. None
See application file for complete search history.

(56) References Cited

U.S. PATENT DOCUMENTS 6,228,694 B1 5/2001 Doyle et al.
6,855,649 B2 2/2005 Christiansen et al.
7,012,316 B1 3/2006 Anderson et al.
2004/0014304 A1* 1/2004 Bhattacharyya .............. 438/570
2004/0166624 A1* 8/2004 Dokumaci et al. .......... 438/231
2005/0212087 A1 9/2005 Akatsu et al.

* cited by examiner

*Primary Examiner*—N Drew Richards
*Assistant Examiner*—Kyoung Lee
(74) *Attorney, Agent, or Firm*—Scully, Scott, Murphy & Presser, P.C.; H. Daniel Schnurmann

(57) ABSTRACT

Semiconductor structures having a decreased semiconductor junction capacitance of a semiconductor junction within an active semiconductor layer may be fabricated using an ion implantation and thermal annealing method. The ion implantation and thermal annealing method provides for a plurality of voids located completely within the active semiconductor layer proximate to the semiconductor junction located within the active semiconductor layer, absent stressing of the active semiconductor layer.

10 Claims, 4 Drawing Sheets

VOID FORMATION FOR SEMICONDUCTOR JUNCTION CAPACITANCE REDUCTION

BACKGROUND

1. Field of the Invention

The invention relates generally to junction capacitance within semiconductor structures. More particularly, the invention relates to junction capacitance reduction within semiconductor structures.

2. Description of the Related Art

Semiconductor structures and semiconductor devices often include semiconductor junctions that are formed between semiconductor regions of different polarity. Semiconductor junctions are an integral part of operation of certain types of semiconductor devices. For example, bipolar transistors and semiconductor diodes are predicated upon the operation of semiconductor junctions.

In other semiconductor structures, semiconductor junctions do not serve an operational purpose within semiconductor devices, but rather the semiconductor junctions result from a requirement that a first semiconductor region of a first polarity of necessity be formed within a second semiconductor region of a second polarity different from the first polarity. Examples of these types of semiconductor junctions are field effect transistor source/drain regions to doped well semiconductor junctions at locations remote from a channel region. Field effect transistor source/drain regions are typically of a polarity different from the polarity of a doped well within which they are formed and located.

The foregoing non-operational semiconductor junctions often possess undesirable characteristics that may compromise performance of a semiconductor structure or a semiconductor circuit within which they are formed. For example, a field effect transistor source/drain region to doped well semiconductor junction may in particular yield a semiconductor junction capacitance that otherwise compromises performance of the semiconductor circuit within which the field effect transistor is used. Such compromised performance may be in the form of an undesirable semiconductor junction capacitance contribution to a resistive-capacitive time delay within the semiconductor circuit.

Various novel semiconductor structures, and methods for fabrication thereof, that may be used for enhancing performance within semiconductor devices and circuits are known in the semiconductor fabrication art.

For example, Doyle et al., in U.S. Pat. No. 6,228,694, teaches a method for increasing charge carrier mobility within a metal oxide semiconductor (MOS) transistor by use of strategically located regions of locally enhanced stress. Within this particular prior art method, the regions of locally enhanced stress are formed incident to thermal annealing of a semiconductor substrate that was implanted with an inert material, to provide inert material voids within the semiconductor substrate.

In addition, Christiansen et al., in U.S. Pat. No. 6,855,649, teaches an ion implantation and thermal annealing method for forming a relaxed silicon-germanium alloy layer upon a silicon-on-insulator (SOI) substrate. This particular prior art method uses a helium ion implantation to provide platelets (and in particular not voids) beneath a silicon-germanium alloy layer to silicon layer interface within the silicon-on-insulator (SOI) substrate.

Further Akutsu, in U.S. Pub. No. 2005/0212087, teaches a particular bipolar transistor structure with a reduced collector-to-base capacitance. This particular prior art structure achieves the reduced collector-to-base capacitance by using laterally adjacent a collector pedestal located therein a low capacitance region comprising a void located within a dielectric layer.

Finally, Anderson et al., in U.S. Pat. No. 7,012,316, teaches an integrated circuit isolation structure that may be fabricated with enhanced efficiency. The integrated circuit isolation structure comprises: (1) a lower lying bubble implanted semiconductor region; and (2) an upper lying electrically insulating cap region.

Semiconductor structure dimensions and semiconductor device dimensions are certain to continue to decrease. As a result thereof, undesirable junction capacitance effects within certain semiconductor structures and certain semiconductor devices may become pronounced. Desirable are semiconductor structures, semiconductor devices and methods for fabricating the semiconductor structures and semiconductor devices that provide for reduced semiconductor junction capacitance.

SUMMARY OF THE INVENTION

The invention includes semiconductor structures that have a decreased semiconductor junction capacitance, and methods for fabricating the semiconductor structures. The invention provides the reduced semiconductor junction capacitance by forming a plurality of voids completely within an active semiconductor layer proximate to a semiconductor junction located within the active semiconductor layer. The plurality of voids does not stress the active semiconductor layer. The plurality of voids is preferably filled with an inert material, such as helium, neon, argon, krypton or xenon.

Within the embodiments and invention (i.e., particularly as claimed), an "active semiconductor layer" is intended as a semiconductor layer within which is fabricated at least in part a semiconductor device having a semiconductor junction. Thus, inactive semiconductor layers are intended as semiconductor layers that may be used within structures other than those that lead to fabrication of active semiconductor devices and semiconductor junctions. For example, and without limitation, an inactive semiconductor layer may comprise a semiconductor layer that is used within an isolation region which is not intended as an "active semiconductor layer" in accordance with the invention.

Within the embodiments and the invention, "proximate" with respect to a relative location of a plurality of voids and a semiconductor junction is intended to indicate that the plurality of voids exerts an influence upon the semiconductor junction. A particular influence of interest within the embodiments is that a plurality of voids influences and reduces a junction capacitance within the semiconductor junction.

A particular semiconductor structure in accordance with the invention includes a semiconductor device including a semiconductor junction located within an active semiconductor layer. The particular structure also includes a plurality of voids located completely within the active semiconductor layer proximate to the semiconductor junction absent stressing of the active semiconductor layer.

Another semiconductor structure in accordance with the invention includes a field effect transistor structure that includes a gate electrode located over a channel region that separates a pair of source/drain regions within an active semiconductor layer. The pair of source/drain regions includes a pair of source/drain junctions within the active semiconductor layer. This other semiconductor structure also includes a plurality of voids located completely within the active semiconductor layer proximate to the pair of source/drain junctions, absent stressing of the active semiconductor layer.

A method in accordance with the invention includes forming completely within an active semiconductor layer a void filled region that does not stress the active semiconductor layer. The method also includes forming within the active semiconductor layer a semiconductor device having a semiconductor junction. The method provides that the void filled region and the semiconductor junction are located proximately.

BRIEF DESCRIPTION OF THE DRAWINGS

The objects, features and advantages of the invention are understood within the context of the Description of the Preferred Embodiments, as set forth below. The Description of the Preferred Embodiments is understood within the context of the accompanying drawings, which form a material part of this disclosure, wherein.

DESCRIPTION OF THE PREFERRED EMBODIMENTS

The invention, which includes semiconductor structures having decreased junction capacitance, and methods for fabricating the semiconductor structures, is described in further detail below and understood within the context of the drawings described above. Since the drawings are intended for illustrative purposes, the drawings are not necessarily drawn to scale.

Figure 1:
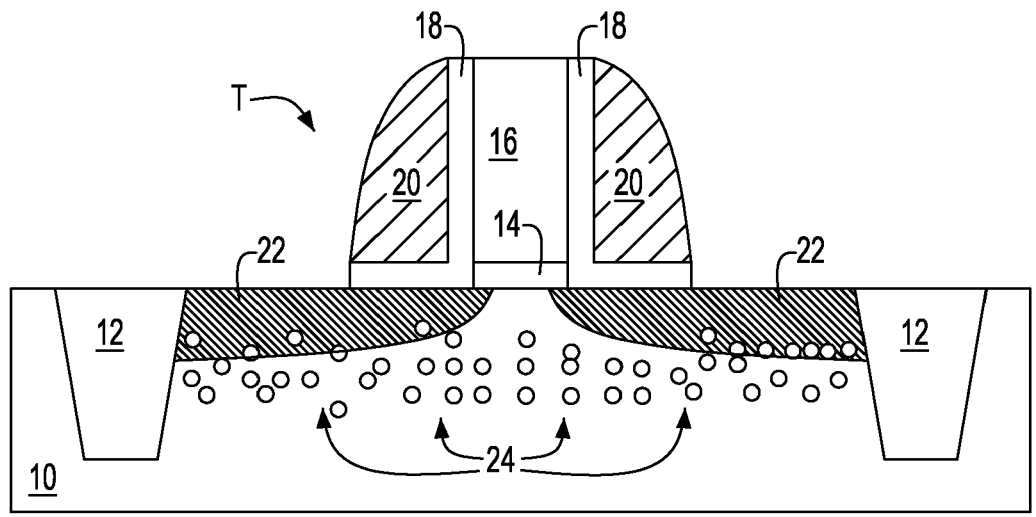
FIG. 1 shows a schematic cross-sectional diagram of a semiconductor structure in accordance with an embodiment of the invention.

FIG. 1 shows a schematic cross-sectional diagram of a semiconductor structure in accordance with an embodiment of the invention. This particular embodiment comprises a first embodiment of the invention.

The semiconductor structure comprises a semiconductor substrate 10. A pair of isolation regions 12 is separated by an active region (i.e., an active semiconductor layer), within the semiconductor substrate 10. A field effect transistor T0 is located within the active region.

The field effect transistor T0 comprises a gate dielectric 14 located upon the active region of the semiconductor substrate 10. A gate electrode 16 is located aligned upon the gate dielectric 14, although such alignment is not a requirement of the embodiment or of the invention. A pair of first spacer layers 18 and a pair of second spacer layer 20 (illustrated as plural layers in cross-sectional view, but intended as single layers in plan view) adjoin or are adjacent a pair of opposite sidewalls of the gate electrode 16 and the gate dielectric 14. Finally, a pair of source/drain regions 22 is located within the active region of the semiconductor substrate 10 and separated by a channel region located beneath the gate electrode 16.

The foregoing layers and structures provide a generally conventional field effect transistor T0 fabricated within a bulk semiconductor substrate 10.

Finally, FIG. 1 also shows a plurality of voids 24 located within the active region of the semiconductor substrate 10 (which serves as an active semiconductor layer in accordance with the invention as claimed). The plurality of voids 24 is located proximate to the source/drain region 22 junctions with the semiconductor substrate 10. The plurality of voids 24 may be located at least in part above the source/drain region 22 junctions, located at least in part below the source/drain region 22 junctions or located to encompass the source/drain region 22 junctions. The plurality of voids 24 is located completely within the semiconductor substrate 10. The plurality of voids is also located so as not to stress the semiconductor substrate 10.

As is illustrated in FIG. 1, the plurality of voids 24 (i.e., bounded by the isolation regions 12) is located at a uniform distance beneath both: (1) the source/drain regions 22; and (2) a channel region separated by the source/drain regions 22, within the field effect transistor T0. The uniformity of distance of the plurality of voids 24 within the semiconductor substrate 10, as well as a uniform volume density of the plurality of voids 24 at the uniform distance, provides that the plurality of voids 24 does not stress the semiconductor substrate 10 (i.e., implicitly, the voids 24 provided at only the uniform distance within the semiconductor substrate 10 and also only at a uniform density at the uniform distance, do not stress the semiconductor substrate 10).

While FIG. 1 illustrates a particular uniform geometric configuration of the plurality of voids 24 that does not stress the semiconductor substrate 10, the invention does not contemplate that this particular geometric configuration limits the invention. Rather the invention contemplates that there may exist alternative geometric configurations of voids that also do not stress a semiconductor substrate or an active semiconductor layer in accordance with the invention. Absence of stress within a semiconductor substrate or an active semiconductor layer may be readily determined incident to measurement of an intrinsic deflection of the semiconductor substrate or active semiconductor layer from a true planar configuration.

Within the embodiments, a plurality of voids (such as the plurality of voids 24) that is proximate to a semiconductor junction (such as the source/drain region 22 to semiconductor substrate 10 junctions) provides the beneficial effect of lowering a junction capacitance within a semiconductor device (such as the field effect transistor T0) that comprises the semiconductor junction. The junction capacitance reduction results from a lower permittivity constant of a low pressure inert gas or a vacuum that comprises the plurality of voids 24, in comparison with a permittivity constant (or dielectric constant) of a material that comprises the semiconductor substrate 10. For example, a dielectric constant of silicon is about 11. A junction capacitance for a silicon semiconductor junction is typically calculated using the equation:

$$C = A(\epsilon_{Si}/W_d)$$

where C equals the junction capacitance, A equals a junction area, $\epsilon_{Si}$ equals a dielectric or permittivity constant (typically about 11 for a silicon semiconductor material) and $W_d$ equals a depletion width (i.e., a depletion depth) within the silicon semiconductor substrate. The embodiments effectively lower a semiconductor substrate permittivity constant and thus also lower a junction capacitance of a semiconductor junction located within the semiconductor substrate. The junction capacitance is lowered while not creating a floating body effect with respect to a semiconductor device that comprises the semiconductor junction, since a plurality of voids (such as the plurality of voids 24) does not impede electrical current travel through the active semiconductor layer (such as the semiconductor substrate 10). Rather, the plurality of voids 24 only lowers a permittivity constant of a void filled portion of the active semiconductor layer.

Although the instant embodiment illustrates the invention within the context of a bulk semiconductor substrate 10, neither the embodiment nor the invention is intended to be so limited. Rather, as will be illustrated within the context of further disclosure below, additional embodiments of the invention are also contemplated within the context of a semiconductor-on-insulator substrate and/or a hybrid orientation (HOT) substrate. Both the semiconductor-on-insulator substrate and the hybrid orientation (HOT) substrate are illustrated in further detail below. In particular, a hybrid orientation (HOT) substrate comprises multiple regions of different crystallographic orientations within a single semiconductor substrate.

FIG. 2 to FIG. 10 show a series of schematic cross-sectional diagrams illustrating the results of progressive stages in fabricating a semiconductor structure related to the semiconductor structure whose schematic cross-sectional diagram is illustrated in FIG. 1. This other semiconductor structure comprises an other embodiment of the invention that comprises a second embodiment of the invention.

Figure 2:
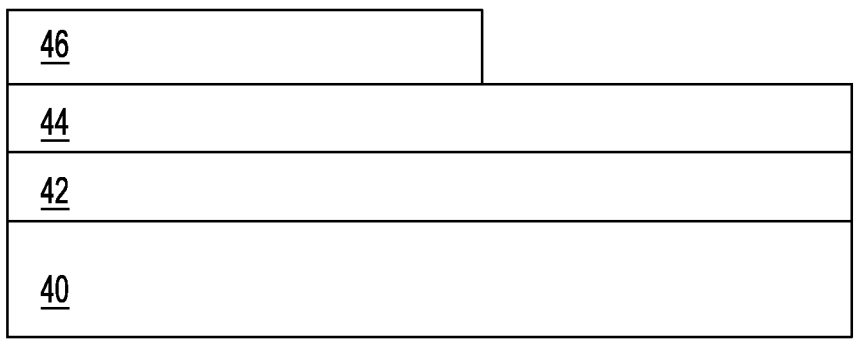
FIG. 2 to FIG. 10 show a series of schematic cross-sectional diagrams illustrating the results of progressive stages in fabricating a semiconductor structure in accordance with another embodiment of the invention.

FIG. 2 shows a schematic cross-sectional diagram of the semiconductor structure at an early stage in the fabrication thereof of the other semiconductor structure.

FIG. 2 shows a base semiconductor substrate 40. A buried dielectric layer 42 is located upon the base semiconductor substrate 40. A surface semiconductor layer 44 is located upon the buried dielectric layer 42. In an aggregate, the base semiconductor substrate 40, the buried dielectric layer 42 and the surface semiconductor layer 44 comprise a semiconductor-on-insulator substrate. FIG. 2 also shows a hard mask layer 46 located upon the surface semiconductor layer 44 within the semiconductor-on-insulator substrate.

The base semiconductor substrate 40 may comprise any of several semiconductor materials. Non-limiting examples include silicon, germanium, silicon-germanium alloy, silicon carbide, silicon-germanium carbide alloy and compound (i.e., III-V and II-VI) semiconductor materials. Non-limiting examples of compound semiconductor materials include gallium arsenide, indium arsenide and indium phosphide semiconductor materials. Typically, the base semiconductor substrate 40 has a thickness from about 0.5 to about 1.5 mm.

The buried dielectric layer 42 may comprise any of several dielectric materials. Non-limiting examples include oxides, nitrides and oxynitrides of silicon. Oxides, nitrides and oxynitrides of other elements are not excluded. The buried dielectric layer 42 may comprise a crystalline or a non-crystalline dielectric material, with crystalline dielectrics being highly preferred. The buried dielectric layer 42 may be formed using any of several methods. Non-limiting examples include ion implantation methods, thermal or plasma oxidation or nitridation methods, chemical vapor deposition methods and physical vapor deposition methods. Typically, the buried dielectric layer 42 comprises an oxide of the semiconductor material from which is comprised the base semiconductor substrate 40. Typically, the buried dielectric layer 42 has a thickness from about 50 to about 200 angstroms.

The surface semiconductor layer 44 may comprise any of the several semiconductor materials from which the base semiconductor substrate 40 may be comprised. In general, the surface semiconductor layer 44 and the base semiconductor substrate 40 may comprise either identical or different semiconductor materials with respect to chemical composition, dopant concentration and crystallographic orientation. More particularly within the instant embodiment, the surface semiconductor layer 44 and the base semiconductor substrate 40 include semiconductor materials that comprise at least different crystallographic orientations. Typically one of the surface semiconductor layer 44 and the base semiconductor substrate 40 has a 110 crystallographic orientation and the other of the surface semiconductor layer 44 and the base semiconductor substrate 40 has a 100 crystallographic orientation. Typically, the surface semiconductor layer 44 has a thickness from about 500 to about 1000 angstroms.

The hard mask layer 46 comprises a hard mask material. Non-limiting examples of hard mask materials include oxides, nitrides and oxynitrides of silicon. Oxides, nitrides and oxynitrides of other elements may also be used as hard mask materials. The hard mask materials may be formed using any of several methods that are conventional in the semiconductor fabrication art. Non-limiting examples include thermal or plasma oxidation or nitridation methods, chemical vapor deposition methods and physical vapor deposition methods. Typically, the hard mask layer 46 comprises one of a silicon oxide, a silicon nitride and a silicon oxynitride material. Typically the hard mask layer 46 has a thickness from about 300 to about 1500 angstroms.

Figure 3:
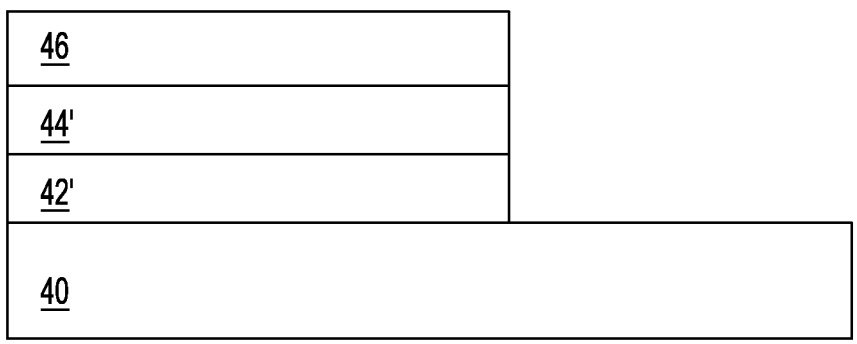

FIG. 3 shows the results of etching the surface semiconductor layer 44 and the buried dielectric layer 42 while using the hard mask layer 46 as an etch mask layer. Resulting from the foregoing etching of the surface semiconductor layer 44 and the buried dielectric layer 42 are a corresponding surface semiconductor layer 44' and a corresponding buried dielectric layer 42'. The stack comprising the hard mask layer 46, the surface semiconductor layer 44' and the buried dielectric layer 42' leaves exposed a portion of the base semiconductor substrate 40.

Etching of the surface semiconductor layer 44 and the buried dielectric layer 42 to provide the surface semiconductor layer 44' and the buried dielectric layer 42' may be effected using methods that are conventional in the semiconductor fabrication art. Non-limiting example of methods include wet chemical etch methods and dry plasma etch methods. Dry plasma etch methods are more common insofar as they provide substantially vertical sidewalls to the surface semiconductor layer 44' and the buried dielectric layer 42'. Dry plasma etch methods will typically comprise: (1) a chlorine containing etchant gas composition for etching a surface semiconductor layer comprising a silicon containing semiconductor material; and (2) a fluorine containing etchant gas composition for etching a buried dielectric layer comprising a silicon continuing dielectric material.

Figure 4:
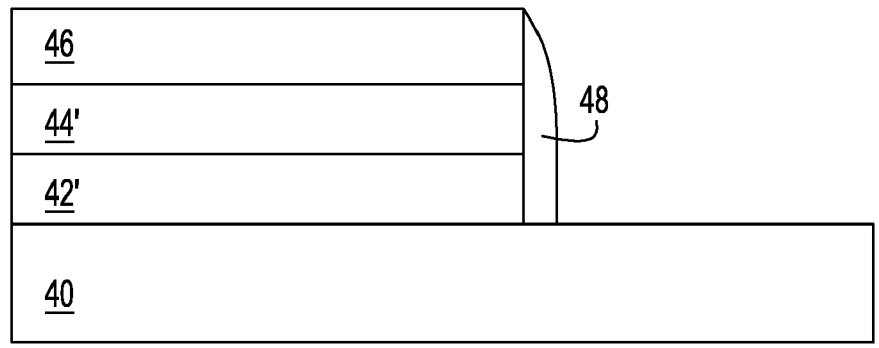

FIG. 4 shows a spacer layer 48 located adjoining exposed sidewalls of the hard mask layer 46, the surface semiconductor layer 44' and the buried dielectric layer 42'.

The spacer layer 48 may be formed using a generally conventional blanket spacer material layer deposition and an anisotropic etchback method. Typically, the blanket spacer material layer comprises a dielectric material in order to provide sidewall isolation to the surface semiconductor layer 44'. The spacer layer 48 may comprise a dielectric material selected from the group consisting of oxides, nitrides and oxynitrides of silicon. Again, oxides, nitrides and oxynitrides of other elements are not excluded. Typically, the spacer layer 48 comprises a silicon nitride material similar to the silicon nitride material that may be used for forming the hard mask layer 46.

Figure 5:
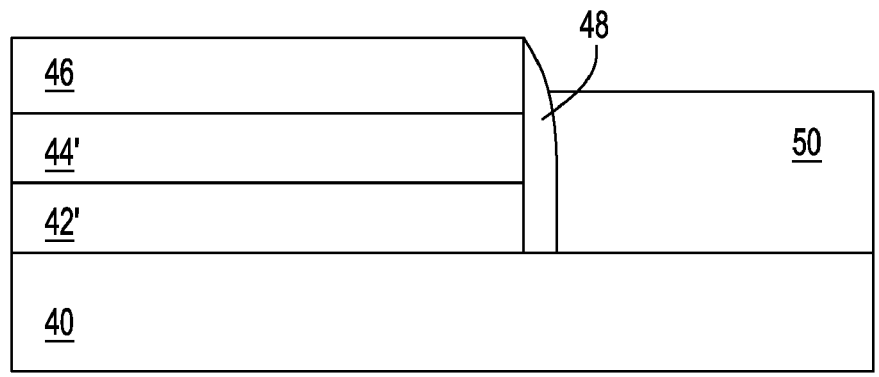

FIG. 5 shows the results of epitaxially growing an epitaxial surface semiconductor layer 50 from the base semiconductor substrate 40. The epitaxial surface semiconductor layer 50 is grown epitaxially while using the base semiconductor substrate 40 as a crystallographic template. Thus, in accordance with disclosure above, the surface semiconductor layer 44' and the epitaxial surface semiconductor layer 50 comprise different crystallographic orientations. A particular crystallographic orientation of the base semiconductor substrate 40 is replicated into the epitaxial surface semiconductor layer 50 when epitaxially growing the epitaxial surface semiconductor layer 50. Although the epitaxial surface semiconductor surface layer 50 and the base semiconductor substrate 40 thus have an identical crystallographic orientation, the epitaxial surface semiconductor layer 50 and the base semiconductor substrate 40 need not necessarily have the same semiconductor material composition, although generally the epitaxial surface semiconductor layer 50 and the base semiconductor substrate 40 will have the same chemical composition.

Figure 6:
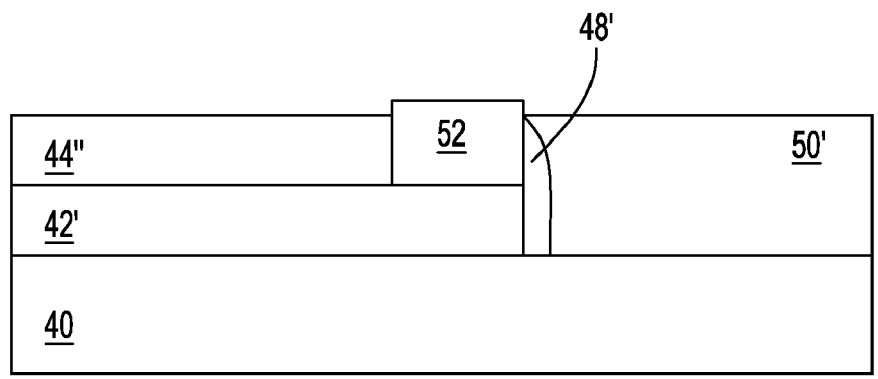

FIG. 6 first shows the results of stripping the hard mask layer 46 from the semiconductor structure of FIG. 5. The hard mask layer 46 may be stripped using methods and materials that are otherwise generally conventional in the semiconductor fabrication art. Wet chemical stripping methods, dry plasma stripping methods and aggregate stripping methods thereof are common stripping methods. Any of the foregoing stripping methods and materials may be used for stripping the hard mask layer 46 from the semiconductor structure of FIG. 5 to provide in part the semiconductor structure of FIG. 6.

FIG. 6 also shows the results of planarizing the spacer layer 48 to form a spacer layer 48' and planarizing the epitaxial surface semiconductor layer 50 to form an epitaxial surface semiconductor layer 50'. The spacer layer 48' and the epitaxial surface semiconductor layer 50' are planarized generally to the level of the surface semiconductor layer 44'.

The foregoing planarization may be effected using methods including, but not limited to mechanical planarizing methods, chemical mechanical polish planarizing methods and aggregate planarizing methods thereof. Chemical mechanical polish planarizing methods are particularly common.

FIG. 6 finally shows the results of forming an isolation region 52 interposed between a surface semiconductor layer 44" and the planarized spacer layer 48'.

The isolation region 52 may be formed using methods and materials that are conventional in the semiconductor fabrication art. Typically, an isolation trench is first formed incident to further patterning of the surface semiconductor layer 44' to form the surface semiconductor layer 44". This further patterning is effected using methods and materials similar to the methods and materials used for patterning the surface semiconductor layer 44 that is illustrated in FIG. 2 to provide the surface semiconductor layer 44' that is illustrated in FIG. 3.

The isolation trench is then over-filled with a dielectric isolation material that is formed using a blanket layer deposition method. The over-filled dielectric isolation material is then planarized to form the isolation region 52. Planarization may be effected using any of several methods. Non-limiting examples include etchback planarizing methods, mechanical planarizing methods and chemical mechanical polish planarizing methods. The dielectric isolation material which comprises the isolation region 52 may comprise the same dielectric materials from which may be comprised the buried dielectric layer 42.

Figure 7:
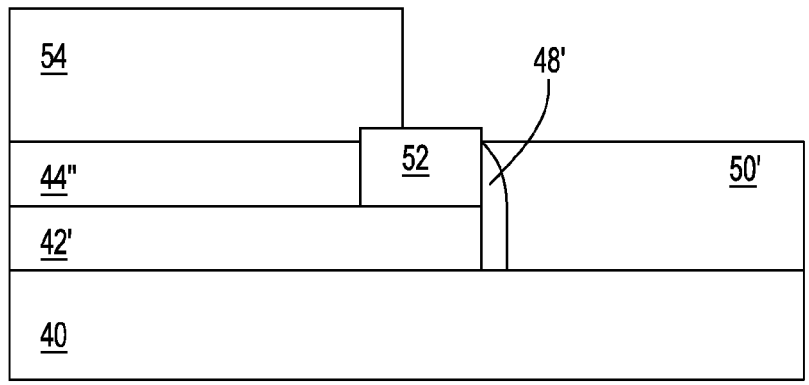

FIG. 7 shows a mask layer 54 located upon and covering the surface semiconductor layer 44". The mask layer 54 may be formed from any of several mask materials. Included are hard mask materials, and more particularly photoresist mask materials. In general, photoresist mask materials may comprise photoresist materials selected from the group consisting of positive photoresist materials, negative photoresist materials and hybrid photoresist materials. Typically, the mask layer 54 comprises a photoresist mask material that has a thickness from about 1500 to about 4000 angstroms.

Figure 8:
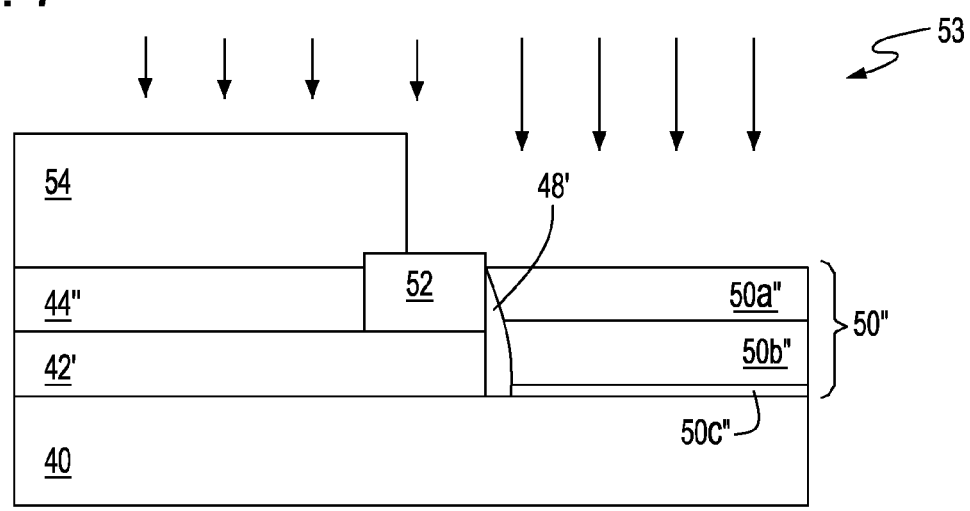

FIG. 8 shows the results of implanting the epitaxial surface semiconductor layer 50' with a dose of void forming ions 53 while using the mask layer 54 as an ion implantation mask layer. The foregoing ion implantation forms an unimplanted upper region 50a" and an optional unimplanted lower region 50c" of an epitaxial surface semiconductor layer 50" that are separated by an implanted middle region 50b" of the epitaxial surface semiconductor layer 50". The void forming ions 53 may comprise any of several void forming species, but in particular the void forming ions 53 generally comprise inert species. Candidate non-inert species for the void forming ions 53 include, but are not limited to oxygen ions and nitrogen ions. Candidate inert species for the void forming ions 53 include, but are not limited to helium, neon, argon, krypton and xenon ions. Other ion implantable void forming species are not excluded.

Typically, the void forming ions 53 are implanted at an ion implantation dose from about 1E15 to about 1E17 ions per square centimeter and an ion implantation energy from about 2 to about 35 keV. The foregoing ion implantation conditions provide: (1) the unimplanted upper region 50a" of the epitaxial surface semiconductor layer 50" having a thickness from about 200 to about 800 angstroms; (2) the implanted middle region 50b" of the epitaxial surface semiconductor layer 50" having a thickness from about 300 to about 800 angstroms; and (3) the optional unimplanted lower region 50c" of the epitaxial surface semiconductor layer 50" having a thickness of up to about 200 angstroms.

Figure 9:
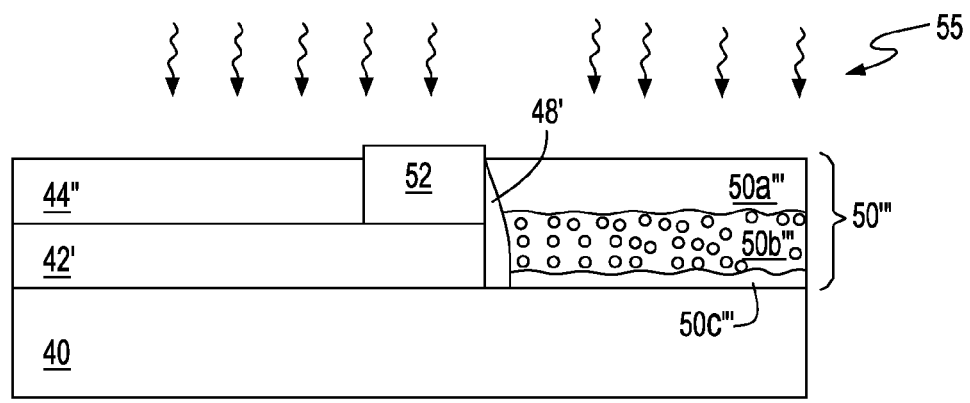

FIG. 9 first shows the results of stripping the mask layer 54 from the semiconductor structure of FIG. 8. The mask layer 54 may be stripped using methods and materials that are otherwise conventional in the semiconductor fabrication art, and appropriate to a mask material from which is comprised the mask layer 54. Non-limiting examples include wet chemical stripping methods, dry plasma stripping methods and aggregate stripping methods thereof.

FIG. 9 also shows the results of thermally annealing the resulting semiconductor structure within a thermal annealing environment 55 to form a void filled middle region 50b''' of a thermally annealed epitaxial surface semiconductor layer 50'''. The void filled middle region 50b''' separates a void free upper region 50a''' and a void free lower region 50c''' of the epitaxial surface semiconductor layer 50'''. The void filled middle region 50b''' comprises voids that have a size ranging from about 0.01 to about 0.5 microns. The volume density of the voids is such that the voids occupy from about 5 to about 90 volume percent of the void filled middle region 50b'''. As disclosed above, the voids are filled with an inert material that typically has a dielectric constant close to unity (i.e., 1 (one)). Thus, the voids provide a lower permittivity than that of a semiconductor material, such as a silicon semiconductor material, within the void filled middle region 50b''' of the epitaxial surface semiconductor layer 50''' in comparison with the void free upper region 50a''' and the void free lower region 50c''' of the epitaxial surface semiconductor layer 50'''.

The thermal annealing environment 55 uses thermal annealing conditions that include: (1) a thermal annealing temperature in a range from about 500° to about 1200° C.; for (2) a thermal annealing time period from about 1 to about 60 minutes, to provide the void filled middle region 50b''' of the epitaxial surface semiconductor layer 50''' from the implanted middle region 50b" of the epitaxial surface semiconductor layer 50" that is illustrated in FIG. 8.

Figure 10:
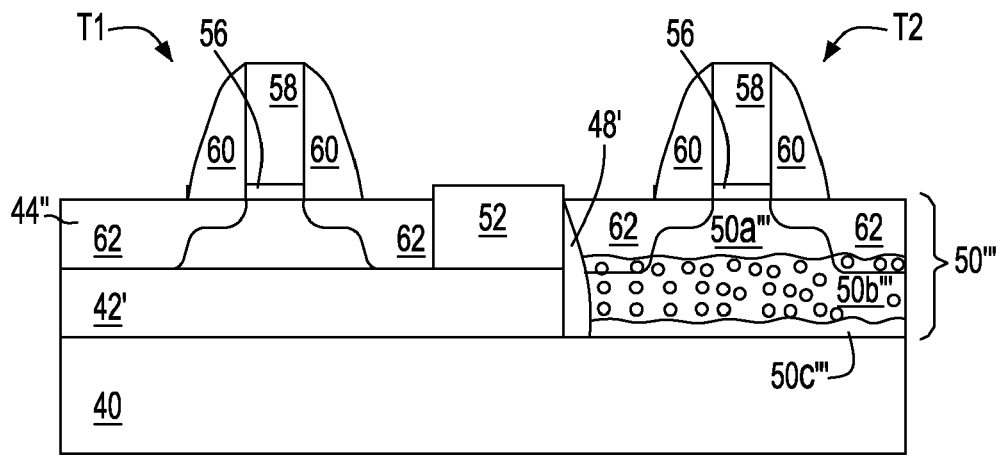

FIG. 10 shows the results of fabricating a first field effect transistor T1 within the surface semiconductor layer 44" and a second field effect transistor T2 within the epitaxial surface semiconductor layer 50'''. In particular, within the second transistor T2, the source/drain region junctions extend into the void filled middle region 50b''' of the epitaxial surface semiconductor layer 50'''. Each of the first field effect transistor T1 and the second field effect transistor T2 may be either a p field effect transistor or an n field effect transistor. Typically, one of the first transistor T1 and the second transistor T2 is a p field effect transistor and the other of the first transistor T1 and the second transistor T2 is an n field effect transistor.

Each of the field effect transistors T1 and T2 comprises: (1) a gate dielectric 56 located upon the surface semiconductor layer 44'' or the void free upper region 50a''' of the epitaxial surface semiconductor layer 50'''; (2) a gate electrode 58 located aligned upon the gate dielectric 56 (although such alignment is not a requirement of the embodiment); (4) a pair (in cross-section, but not in plan view) of spacer layers 60 located adjoining a pair of opposite sidewalls of the gate dielectric 56 and the gate electrode 58; and (5) a pair of source/drain regions 62 located within the surface semiconductor layer 44'' or the epitaxial surface semiconductor layer 50'''. The pair of source/drain regions 62 is separated by a channel region that is aligned beneath the gate electrode 58.

Each of the foregoing layers and structures that comprise the first transistor T1 and the second transistor T2 may comprise materials and have dimensions that are conventional in the semiconductor fabrication art. Each of the foregoing layers and structures that comprise the first transistor T1 and the second transistor T2 may also be formed using methods that are conventional in the semiconductor fabrication art.

The gate dielectric 56 may comprise a conventional dielectric material such as an oxide, nitride or oxynitride of silicon that has a dielectric constant from about 4 to about 20, measured in vacuum. Alternatively, the gate dielectric 56 may also comprise a generally higher dielectric constant dielectric material having a dielectric constant from about 20 to at least about 100. Such higher dielectric constant dielectric materials may include, but are not limited to: hafnium oxides, hafnium silicates, titanium oxides, lanthanum oxides, barium-strontium-titantates (BSTs) and lead-zirconate-titanates (PZTs).

The gate dielectric 56 may be formed using any of several methods that are appropriate to a material of composition of the gate dielectric 56. Included, but not limiting are thermal or plasma oxidation or nitridation methods, chemical vapor deposition methods (including atomic layer deposition methods) and physical vapor deposition methods (including sputtering methods). Typically, the gate dielectric 56 comprises a thermal silicon oxide dielectric material that has a thickness from about 10 to about 70 angstroms.

The gate electrode 58 may comprise materials including, but not limited to certain metals, metal alloys, metal nitrides and metal silicides, as well as laminates thereof and composites thereof. The gate electrode 58 may also comprise doped polysilicon or polysilicon-germanium alloy materials (i.e., having a dopant concentration from about 1e18 to about 1e22 dopant atoms per cubic centimeter) and polycide materials (doped polysilicon/metal silicide stack materials). Similarly, the foregoing materials may also be formed using any of several methods. Non-limiting examples include salicide methods, chemical vapor deposition methods and physical vapor deposition methods, such as, but not limited to evaporative methods and sputtering methods. Typically, the gate electrode 58 comprises a doped polysilicon material that has a thickness from about 600 to about 2000 angstroms.

The spacer layers 60 may comprise spacer materials including, but not limited to conductor spacer materials and dielectric spacer materials. Conductor spacer materials are less common, but are nonetheless known. Dielectric spacer materials are more common. The spacer materials may be deposited using methods analogous, equivalent or identical to the methods that are used for forming the isolation region 52. The spacer layers 60 are also formed with the distinctive inward pointing spacer shape by using a blanket layer deposition and anisotropic etchback method. Typically, the spacer layers 60 comprise a silicon oxide dielectric material.

Finally, the source/drain regions 62 comprise a generally conventional n or p conductivity type dopant. As is understood by a person skilled in the art, the source/drain regions 62 are formed using a two step ion implantation method. A first ion implantation process step within the method uses the gate electrode 58, absent the pair of spacer layers 60, as a mask to form a pair of extension regions each of which extends beneath the spacer layers 60. A second ion implantation process step uses the gate electrode 58 and the spacer layers 62 as a mask to form the larger contact region portions of the source/drain regions 62, while simultaneously incorporating the pair of extension regions.

FIG. 10 shows a schematic cross-sectional diagram of a semiconductor structure in accordance with a second embodiment of the invention. The semiconductor structure comprises a hybrid orientation structure further comprising a first field effect transistor T1 located within a surface semiconductor layer 44'' of a semiconductor-on-insulator portion of the hybrid orientation structure. The hybrid orientation structure further comprises a second field effect transistor T2 located within an epitaxial surface semiconductor layer 50''' within a bulk semiconductor portion of the hybrid orientation substrate. Within the hybrid orientation structure the second transistor T2 is separated from a base semiconductor substrate 40 by a void filled region 50b''' of the epitaxial surface semiconductor layer 50''' that comprises an active semiconductor layer in accordance with the embodiment. The void filled region 50b''' is located proximate to source/drain junctions within the second field effect transistor T2 to provide for a lowering of a junction capacitance within the second transistor T2.

The plurality of voids within the void filled region 50b''' is located such as to not stress the epitaxial surface semiconductor layer 50''' or other portions of the hybrid orientation substrate.

Figure 11:
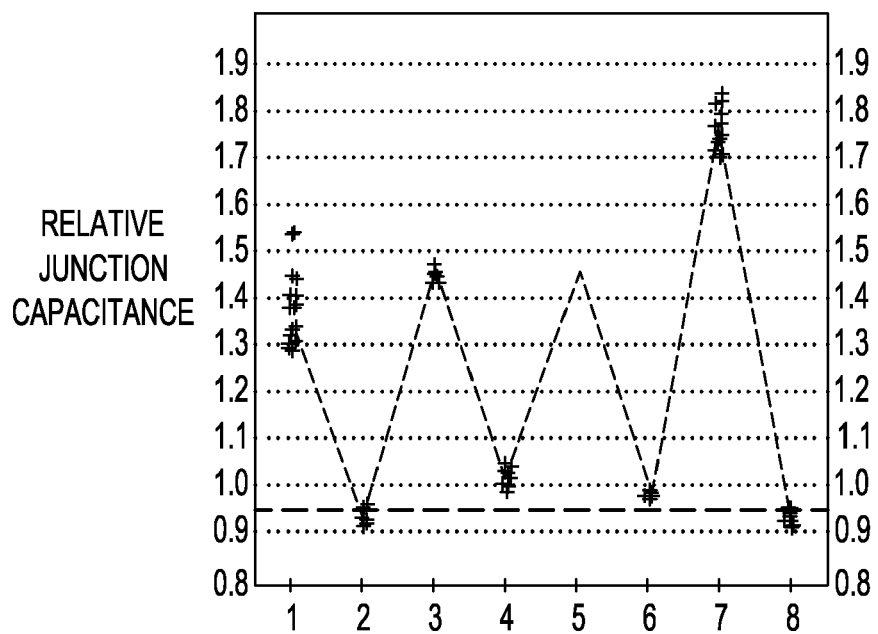
FIG. 11 shows a graph of Relative Junction Capacitance versus Arbitrary Lot Number for a series of field effect transistor devices including field effect transistor devices fabricated in accordance with the invention and not in accordance with the invention.

FIG. 11 shows a graph of Relative Junction Capacitance versus Arbitrary Lot Number for a field effect transistor fabricated generally in accordance with the field effect transistor that is illustrated in FIG. 1.

The data points corresponding with Arbitrary Lot Numbers 1, 3, 5, and 7 correspond with source/drain region 22 to semiconductor substrate 10 junction capacitances of the field effect transistors absent any voids formed proximate to the source/drain region 22 to semiconductor substrate 10 junctions.

The data points that correspond with Arbitrary Lot Number 2 and Arbitrary Lot Number 8 correspond with a void filled region 24 proximate to the source/drain region 22 to semiconductor substrate 10 junctions. The void filled region 24 is formed using a helium ion implant at a dose of about 1e16 helium ions per square centimeter and an ion implantation energy of about 15 keV, followed by thermal annealing at a temperature of about 1000 degrees centigrade for a time period of about 5 minutes. The void filled regions 24 that correspond with Arbitrary Lot Number 4 and Arbitrary Lot Number 6 are formed using a helium ion implant at a dose from about 1e16 helium ions per square centimeter and an ion implantation energy of about 10 keV, and also include the foregoing post helium ion implant thermal annealing conditions.

The lower ion implantation energy within the Arbitrary Lot Numbers 2 and 8 presumably provides for a closer proximity of a void filled region 24 with a source/drain 22 to semiconductor substrate 10 junction, and thus a more optimal reduction in junction capacitance.

As is generally illustrated within the graph of FIG. 11, the void filled regions 24 used in Arbitrary Lot Numbers 2, 4, 6 and 8 provide for considerable reductions in junction capacitance (i.e., up to about 50 percent) in comparison with absence of corresponding void filled regions corresponding with Arbitrary Lot Numbers 1, 3, 5 and 7.

The preferred embodiments of the invention are illustrative of the invention rather than limiting of the invention. Revisions and modifications may be made to methods, materials, structures and dimensions of semiconductor structures and methods for fabrication thereof in accordance with the preferred embodiments, while still providing semiconductor structures and methods in accordance with the invention, further in accordance with the accompanying claims.

What is claimed is:

1. A method for fabricating a semiconductor structure comprising:
    forming completely within an active semiconductor region within a bulk semiconductor substrate a void filled region that does not stress the active semiconductor region; and
    forming within the active semiconductor region a semiconductor device having a semiconductor junction, the void filled region and the semiconductor junction being located proximately, wherein the bulk semiconductor substrate comprises a bulk semiconductor region of a hybrid orientation substrate.

2. The method of claim 1 wherein the forming the void filled region precedes the forming the semiconductor device.

3. The method of claim 1 wherein the forming the semiconductor device precedes the forming the void filled region.

4. The method of claim 1 wherein the forming the void filled region comprises forming a plurality of voids filled with an inert material.

5. The method of claim 4 wherein the inert material is selected from the group consisting of helium, neon, argon, krypton and xenon.

6. The method of claim 1 wherein the forming the semiconductor device comprises forming a field effect transistor device that comprises a pair of source/drain region junctions.

7. The method of claim 6 wherein the void filled region encompasses the source/drain region junctions.

8. The method of claim 1 wherein the forming the void filled region comprises sequentially ion implanting the active semiconductor layer and thermally annealing the active semiconductor layer.

9. The method of claim 1 wherein the void filled region is formed at a uniform distance and a uniform density within an active region bounded by an isolation region within the bulk semiconductor substrate.

10. A method for fabricating a semiconductor structure within an active semiconductor region within a bulk semiconductor substrate comprising:
    forming completely within an active semiconductor layer a void filled region that does not stress the active semiconductor layer, a plurality of voids within the void filled region being filled with an inert gas selected from the group consisting of neon, argon, krypton and xenon; and
    forming within the active semiconductor layer a semiconductor device having a semiconductor junction, the void filled region and the semiconductor junction being located proximately, wherein the bulk semiconductor substrate comprises a bulk semiconductor region of a hybrid orientation substrate.

* * * * *